(12) United States Patent
Greif et al.

(10) Patent No.: US 11,960,092 B2
(45) Date of Patent: Apr. 16, 2024

(54) WAVEGUIDE CONCENTRATOR FOR LIGHT SOURCE

(71) Applicant: Meta Platforms Technologies, LLC, Menlo Park, CA (US)

(72) Inventors: Daniel Guenther Greif, Redmond, WA (US); Scott Charles McEldowney, Redmond, WA (US); Stephen John Holmes, Glasgow (GB); Chadwick Brian Martin, Tucson, AZ (US); Stephen James McNally, Sammamish, WA (US); John Goward, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/959,838

(22) Filed: Oct. 4, 2022

(65) Prior Publication Data

US 2023/0024805 A1 Jan. 26, 2023

Related U.S. Application Data

(62) Division of application No. 16/401,533, filed on May 2, 2019, now Pat. No. 11,493,760.

(Continued)

(51) Int. Cl.
*G02B 27/01* (2006.01)
*F21V 8/00* (2006.01)
(Continued)

(52) U.S. Cl.
CPC ......... *G02B 27/0172* (2013.01); *G02B 6/005* (2013.01); *G02B 6/0085* (2013.01);
(Continued)

(58) Field of Classification Search
CPC .. G02B 27/0172; G02B 6/005; G02B 6/0085; G02B 6/26; G02B 26/0833;
(Continued)

(56) References Cited

U.S. PATENT DOCUMENTS

| 8,121,450 B2 | 2/2012 | Webster et al. |
| 10,168,537 B1 | 1/2019 | Parsons |

(Continued)

FOREIGN PATENT DOCUMENTS

| CN | 109075524 A | 12/2018 |
| WO | 2018044811 A1 | 3/2018 |

OTHER PUBLICATIONS

Office Action dated Feb. 20, 2023 for Chinese Patent Application No. 202080024552.X, filed on Sep. 26, 2021, 16 pages.

(Continued)

*Primary Examiner* — Collin X Beatty
(74) *Attorney, Agent, or Firm* — Greenberg Traurig, LLP

(57) ABSTRACT

A light source or projector for a near-eye display includes a light source subassembly optically coupled to a waveguide concentrator. The light source subassembly may include several semiconductor chips each hosting an array of emitters such s superluminescent light-emitting diodes. The semiconductor chips may be disposed side-by-side, with their emitting sides or facets coupled to the waveguide concentrator, which provides a tight array of output light ports on a common output plane of the concentrator. The output diverging beams at the array of output light ports are coupled to a collimator, which collimates the beams and couples them to an angular scanner for scanning the collimated light beams together across the field of view of the display.

20 Claims, 14 Drawing Sheets

Related U.S. Application Data

(60) Provisional application No. 62/824,321, filed on Mar. 27, 2019.

(51) Int. Cl.
    *G02B 6/26*      (2006.01)
    *G02B 26/08*      (2006.01)
    *G02B 26/10*      (2006.01)
    *H01L 25/075*      (2006.01)

(52) U.S. Cl.
CPC ............ *G02B 6/26* (2013.01); *G02B 26/0833* (2013.01); *G02B 26/101* (2013.01); *G02B 27/0176* (2013.01); *G02B 2027/015* (2013.01); *G02B 2027/0178* (2013.01); *H01L 25/0753* (2013.01)

(58) Field of Classification Search
CPC ............. G02B 26/101; G02B 27/0176; G02B 2027/015; G02B 2027/0178; G02B 6/0068; G02B 6/42; G02B 6/1228; G02B 26/0841; G02B 27/0994; G02B 19/0057; G02B 19/0066; G02B 6/12002; H01L 25/0753

See application file for complete search history.

(56) References Cited

U.S. PATENT DOCUMENTS

| | | | |
|---|---|---|---|
| 11,056,032 B2 * | 7/2021 | Hajati | .................... G06F 3/013 |
| 2002/0031298 A1 | 3/2002 | Hamada | |
| 2003/0081898 A1 | 5/2003 | Tabuchi et al. | |
| 2012/0057607 A1 | 3/2012 | Pezeshki et al. | |
| 2015/0247974 A1 | 9/2015 | Painchaud et al. | |
| 2017/0146744 A1 | 5/2017 | Katsuyama et al. | |
| 2018/0067259 A1 | 3/2018 | Teng et al. | |
| 2018/0120559 A1 | 5/2018 | Yeoh et al. | |
| 2018/0164591 A1 | 6/2018 | Saarikko | |

OTHER PUBLICATIONS

International Search Report and Written Opinion for International Application No. PCT/US2020/020756, dated Jun. 26, 2020, 13 Pages.

* cited by examiner

View B-B

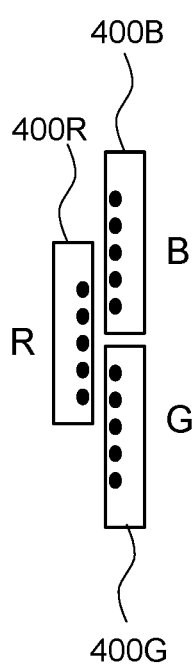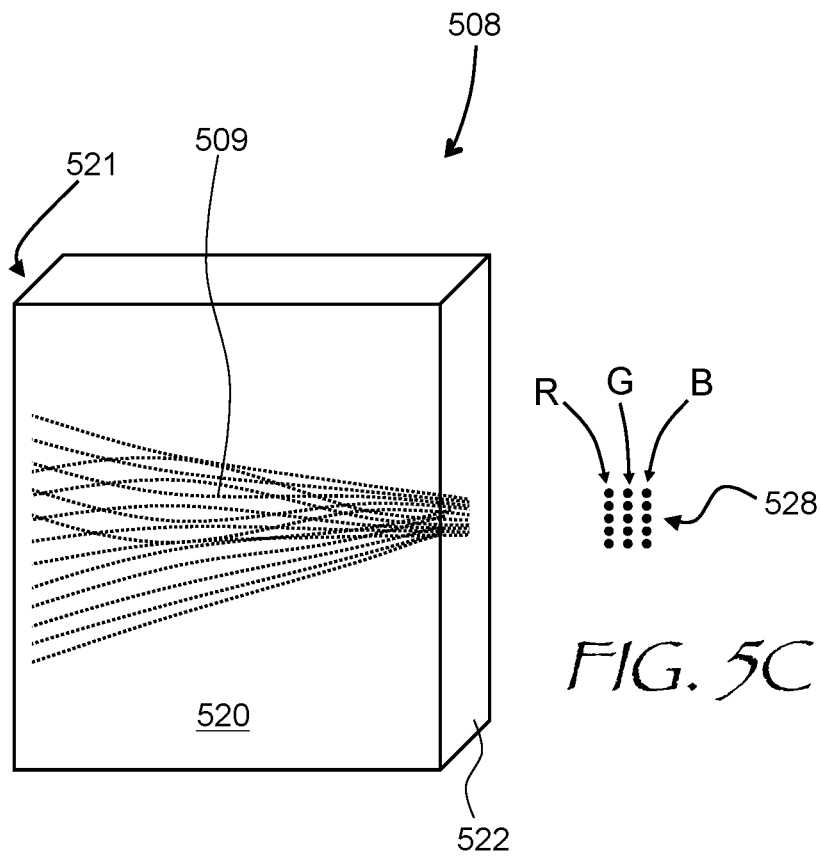
FIG. 5A
FIG. 5B
FIG. 5C

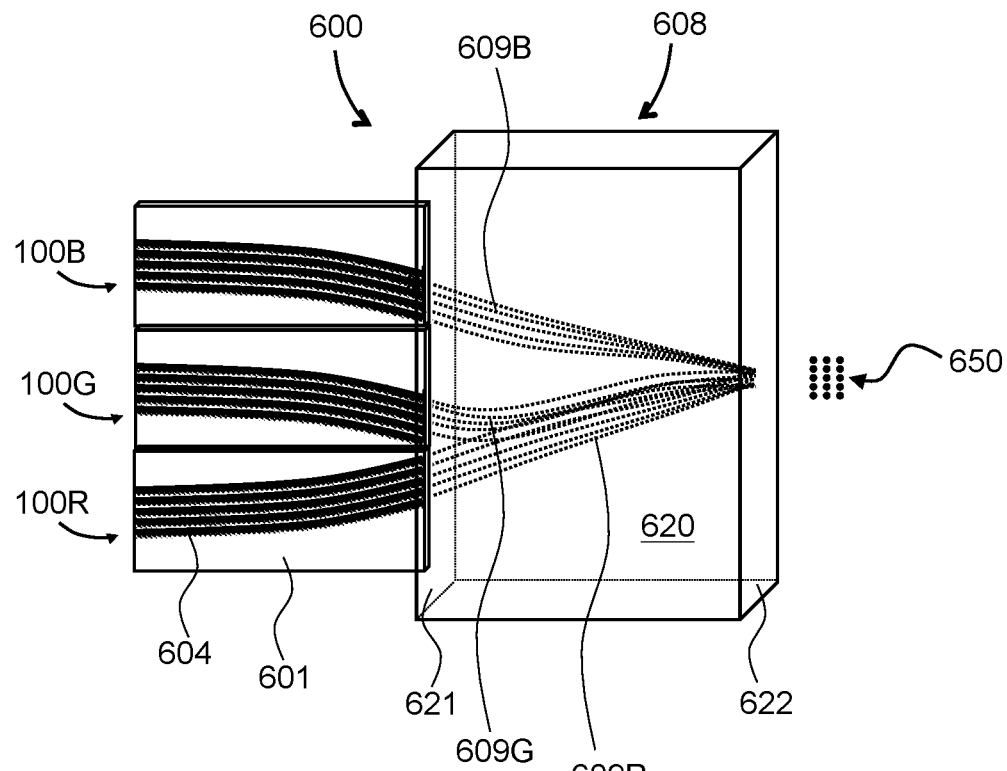
FIG. 6A
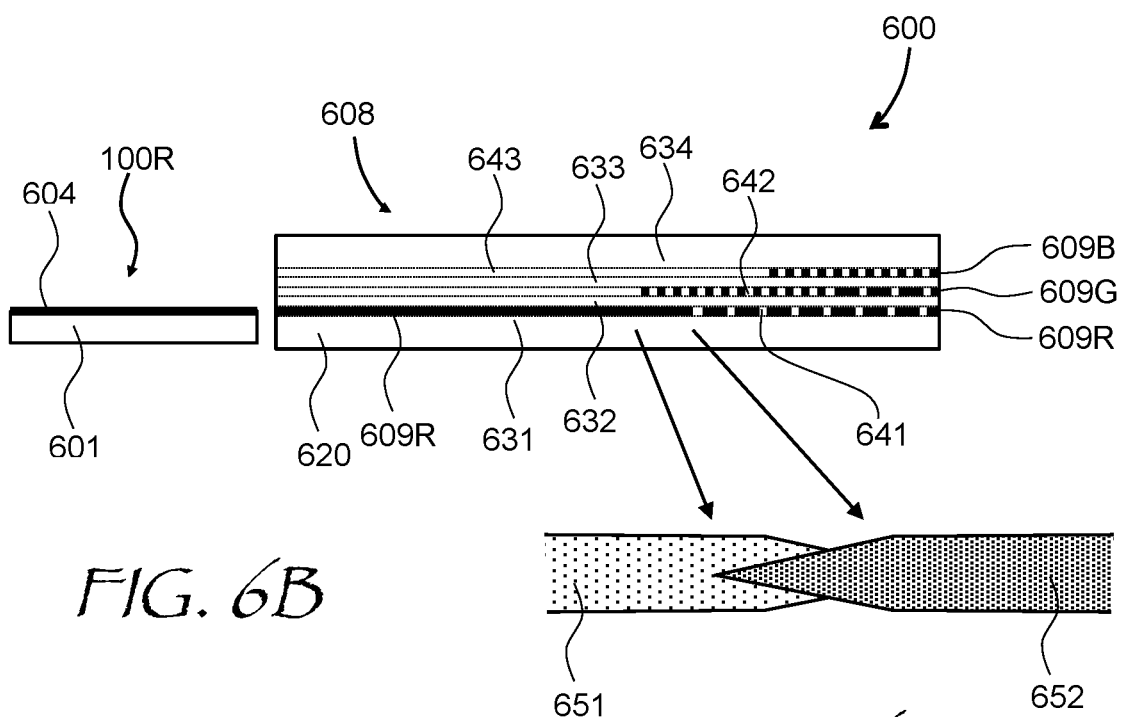
FIG. 6B
FIG. 6C

WAVEGUIDE CONCENTRATOR FOR LIGHT SOURCE

TECHNICAL FIELD

The present application is a divisional of U.S. application Ser. No. 16/401,533 filed May 2, 2019 entitled "Waveguide Concentrator for Light Source" which claims priority from U.S. Provisional Application No. 62/824,321, both of which are incorporated herein by reference in their entirety.

The present disclosure relates to visual displays, and in particular to optical components and modules for a near-eye display.

BACKGROUND

Head-mounted displays (HMDs), near-eye displays (NEDs), and other wearable and stationary display systems can be used to present virtual scenery to a user, or to augment real scenery with dynamic information, data, or virtual objects. The virtual reality (VR) or augmented reality (AR) scenery can be three-dimensional (3D) to enhance the experience and to match virtual objects to real objects observed by the user. Eye position and gaze direction, and/or orientation of the user may be tracked in real time, and the displayed scenery may be dynamically adjusted depending on the user's head orientation and gaze direction, to provide a better experience of immersion into a simulated or augmented environment.

Light sources for wearable displays need to be compact and bright. For color displays, the light sources need to provide a multi-color output including light of red, green, and blue color channels of the image to be displayed. In a scanning wearable color display, the emitted light beams need to have well-defined spatial beam characteristics suitable for beam scanning. Different color channels of a multi-color light beam may be collimated together by a compact collimator for beam scanning over a field of view of the wearable display.

SUMMARY

In accordance with the present disclosure, there is provided an illuminator comprising a light source subassembly. The light source subassembly includes a first substrate supporting a plurality of semiconductor light sources for providing a plurality of optical beams. A waveguide concentrator is optically coupled to the light source subassembly. The waveguide concentrator includes a second substrate comprising first and second ends, and a plurality of waveguides each extending from the first end to the second end. Each waveguide of the plurality of waveguides is configured for receiving an optical beam of the plurality of optical beams at the first end. Spacings between the waveguides at the first end are larger than at the second end.

In some embodiments, the light source subassembly is configured for emitting the plurality of optical beams at an end facet of the first substrate. The waveguide concentrator may further include a microlens array disposed at the first end of the second substrate for receiving the plurality of optical beams. The plurality of semiconductor light sources may include an array of superluminescent light-emitting diodes (SLEDs) supported by the first substrate. In embodiments where the first end of the second substrate includes a first end facet, each waveguide of the plurality of waveguides may form an acute angle with the first end facet. In some embodiments, the light source subassembly further includes a third substrate supporting a plurality of semiconductor light sources for providing a plurality of optical beams. More than one such substrate may be provided. The substrates may be mounted side-by-side on a heat sink. The waveguides of the waveguide concentrator may form a two-dimensional (2D) array of output ports at the second end of the second substrate for outputting light propagated therein. At least some of the waveguides of the waveguide concentrator may extend in three dimensions (3D). The waveguide concentrator may also include a stack of layers supported by the second substrate. At least some waveguides of the waveguide concentrator may include a plurality of waveguide sections disposed in different layers of the stack of layers and optically coupled by inter-layer couplers.

In accordance with the present disclosure, there is provided a projector including any of the waveguide concentrators described above. The projector may further include a collimator optically coupled to the waveguide concentrator at the second end facet of the waveguide concentrator, and a tiltable reflector optically coupled to the collimator for receiving and redirecting the plurality of optical beams collimated by the collimator. The collimator is configured for collimating the plurality of optical beams emitted at the second end facet of the waveguide concentrator, and for redirecting the plurality of optical beams to impinge onto the tiltable reflector.

In some embodiments, the projector further includes a controller operably coupled to the light source subassembly and the tiltable reflector and configured to energize the plurality of semiconductor light sources in coordination with operating the tiltable reflector. Each semiconductor light source of the plurality of semiconductor light sources may include at least one of: a superluminescent light-emitting diode, a laser diode, a vertical-cavity surface-emitting laser diode, or a light-emitting diode.

In accordance with the present disclosure, there is further provided a near-eye display including any of the projector embodiments described above. The near-eye display may further include a pupil replicator optically coupled to the tiltable reflector and configured for providing multiple laterally offset copies of the optical beams redirected by the tiltable reflector.

BRIEF DESCRIPTION OF THE DRAWINGS

Exemplary embodiments will now be described in conjunction with the drawings, in which:

FIGS. 5A to 5C are views of an illuminator including a 3D waveguide concentrator, showing an input light field provided by the light source of FIG. 4A (FIG. 5A); the isometric view of the 3D waveguide concentrator (FIG. 5B); and an output light field (FIG. 5C);

FIG. 6A is a schematic 3D view of an illuminator embodiment including a plurality of semiconductor light source chips disposed side-by-side and coupled to a multilayer waveguide concentrator;

FIG. 6B is a side cross-sectional view of the illuminator embodiment of FIG. 6A;

FIG. 6C is an enlarged top view of an interlayer light coupler of the illuminator of FIG. 6B;

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art. All statements herein reciting principles, aspects, and embodiments of this disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the terms "first", "second", and so forth are not intended to imply sequential ordering, but rather are intended to distinguish one element from another, unless explicitly stated. Similarly, sequential ordering of method steps does not imply a sequential order of their execution, unless explicitly stated.

A solid-state light source array on a semiconductor chip may be used as a light source for a wearable display and its modules. Several semiconductor light source array chips may be combined by e.g. disposing the chips on a common heat sink or silicon optical bench. Collimating light beams emitted by such a combined, multi-chip light source may be a challenging task in view of the chip geometry and emitted beam characteristics. Multiple offset light beams may be emitted at an angle to the emitting surface. In accordance with the present disclosure, a waveguide concentrator may be used to provide a light source with multiple emission points disposed in a single plane perpendicular to an optical axis.

Figure 1A:
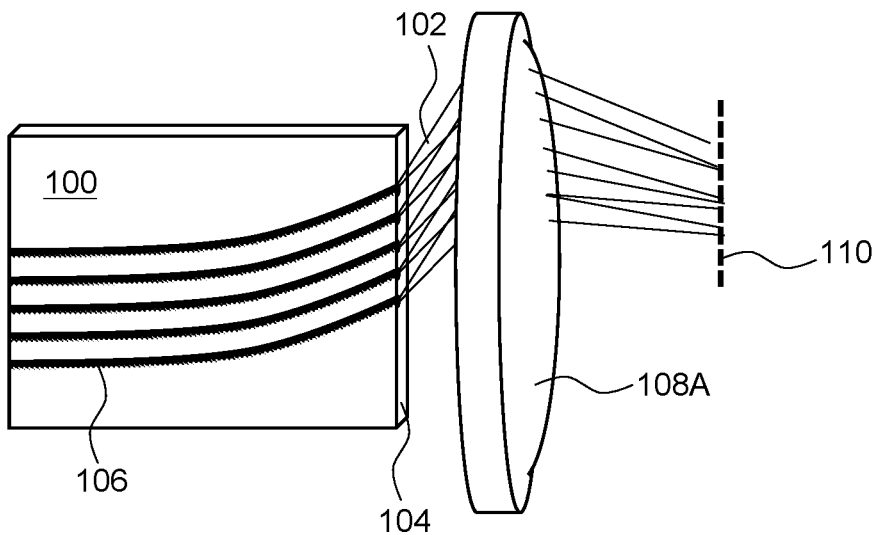
FIG. 1A is a schematic three-dimensional (3D) view of a solid-state light source array coupled to a lens.

Referring to FIG. 1A, a light source subassembly including an array of solid-state light sources 100, e.g. light-emitting diodes such as superluminescent light-emitting diodes (SLEDs), side-emitting laser diodes, etc., emits a plurality of light beams 102 at an output facet 104. To reduce backreflection, waveguides 106 of individual light sources may be disposed at an acute angle to the output facet 104, i.e. not perpendicularly to the output facet 104. A lens 108A is disposed parallel to the output facet 104. The lens 108A receives the plurality of light beams 102 and collimates the light beams 102 at a focal plane 110. The lens 108A needs to have a high numerical aperture (NA) to collimate the light beams 102 without introducing significant beam distortions and aberrations.

Figure 1B:
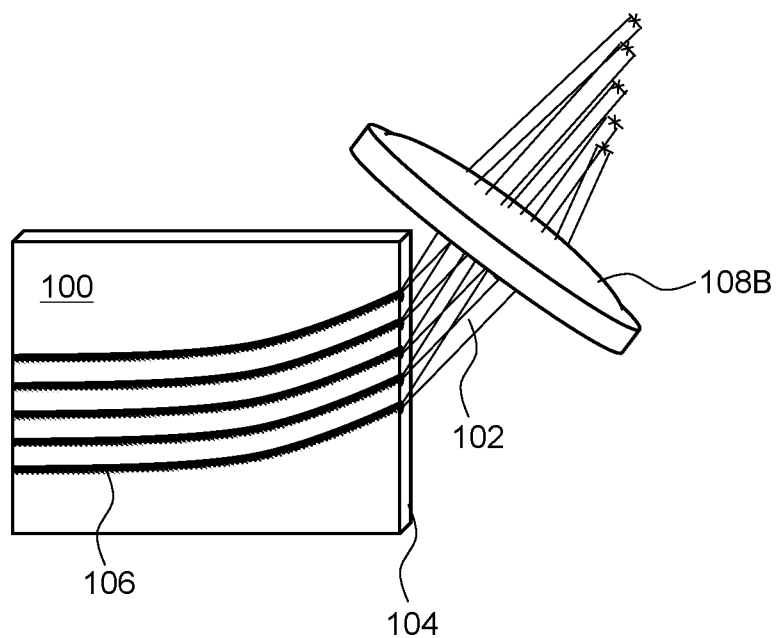
FIG. 1B is a schematic 3D view of a solid-state light source array coupled to a tilted lens.

Referring to FIG. 1B, the array of light sources 100 emits the plurality of light beams 102 at the output facet 104. To reduce backreflection, the waveguides 106 of individual SLEDs may be disposed at an acute angle to the output facet 104, i.e. are not perpendicular to the output facet 104. A lens 108B is disposed at an angle to the output facet 104 and perpendicular to the light beams 102. Due to a narrower range of input ray angles, the lens 108B does not need to have as high NA as the lens 108A of FIG. 1A. The lens 108B of FIG. 1B can also be smaller. However, waists of the collimated beams 102 are no longer disposed in a single plane perpendicular to the direction of propagation of the collimated beams 102. The approximate beam waist positions are shown in FIG. 1B with asterisks (*). The offset waists of the collimated beams 102 may cause problems further along the optical path, as they may be difficult to focus/collimate together.

Figure 2A:
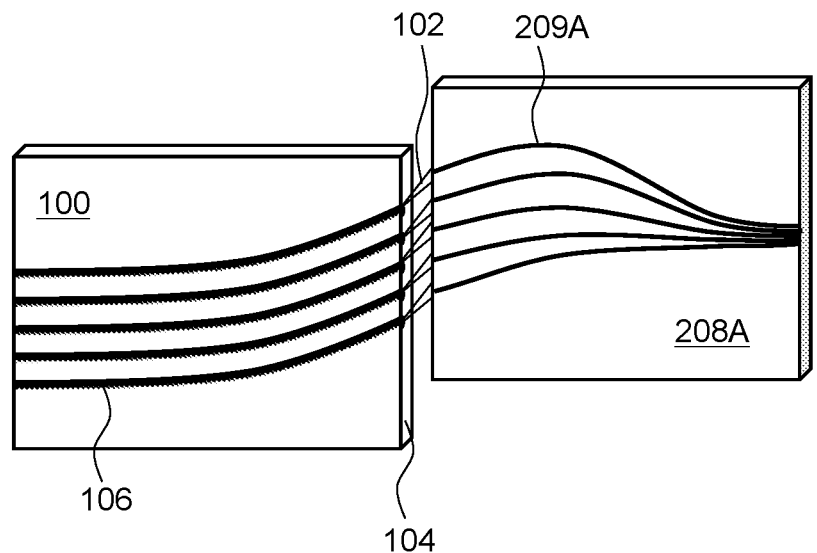
FIG. 2A is a schematic 3D view of a solid-state light source array coupled to a waveguide concentrator.

Turning to FIG. 2A, the array of solid-state light sources 100 emits the plurality of light beams 102 at the output facet 104. To reduce backreflection, the waveguides 106 of individual light sources, such as SLEDs, are disposed at an acute angle to the output facet 104, i.e. are not perpendicular to the output facet 104. A waveguide concentrator 208A is disposed to receive the optical beams 102. Individual waveguides 209A of the waveguide concentrator 208A are disposed to intercept corresponding optical beams 102 with a minimum angular misalignment loss, including angled refraction of light at the corresponding interfaces. Spacings between the waveguides 209A at the distal end facet of the waveguide concentrator 208A are larger than at the proximal end.

Figure 2B:
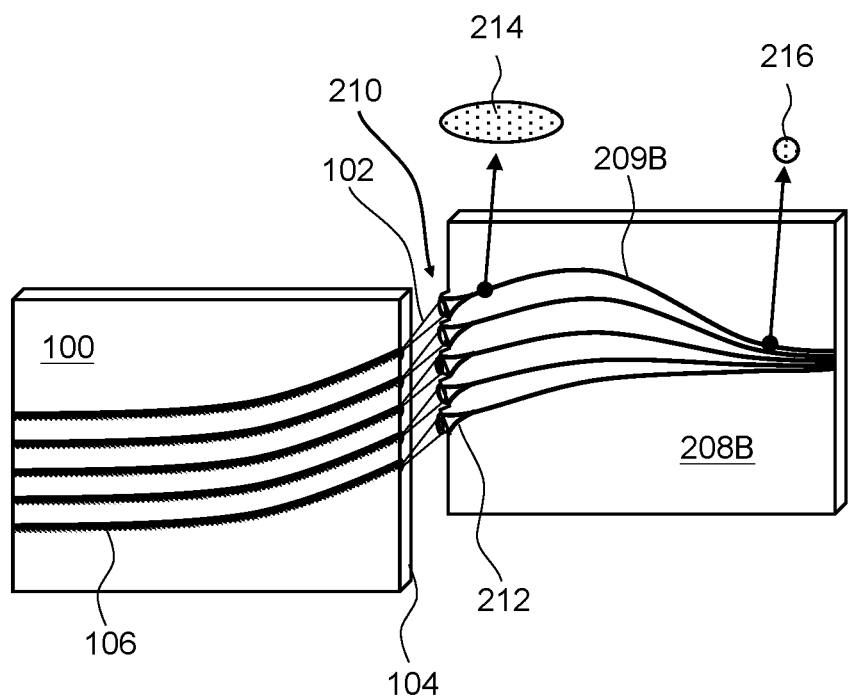
FIG. 2B is a schematic 3D view of a solid-state light source array coupled to a waveguide concentrator including waveguide tapers and an array of microlenses.

Referring to FIG. 2B, a waveguide concentrator 208B is an embodiment of the waveguide concentrator 208A of FIG. 2A. The array of light sources 100 (FIG. 2B) emits the plurality of light beams 102 at the output facet 104. To reduce backreflection, the waveguides 106 of individual light sources are disposed at an angle to the output facet 104, i.e. are not perpendicular to the output facet 104. The waveguide concentrator 208B includes a microlens array 210 for focusing individual optical beams 102 into individual waveguides 209B. The waveguides 209B may include waveguide taper portions 212 for converting a large propagation mode 214 into a smaller propagation mode 216. The waveguides 209A and 209B may include single-mode waveguides. The substrate may include glass, plastic, semiconductor etc.

Figure 3A:
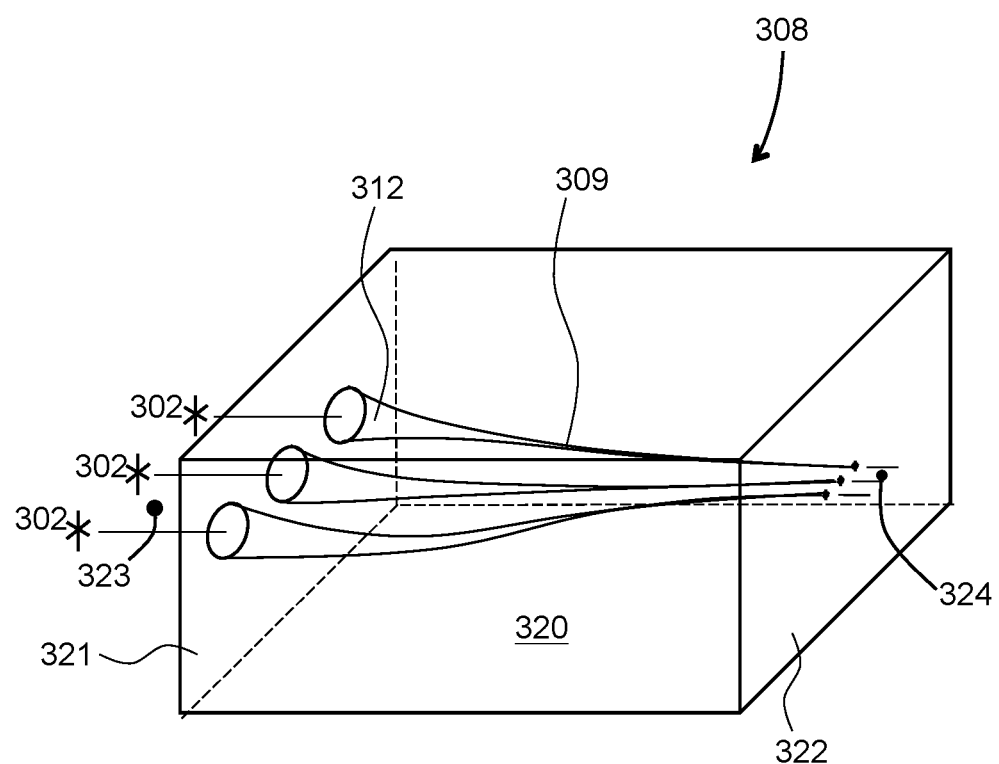
FIG. 3A is a schematic 3D view of a 3D waveguide concentrator including an array of tapered waveguides therein.

Referring to FIG. 3A, a three-dimensional (3D) waveguide concentrator 308 includes a substrate 320 having first 321 and second 322 opposed end facets. A plurality of waveguides 309 extend from the first end facet 321 to the second end facet 322. Only three waveguides 309 are shown for brevity. Generally, two, three, or more waveguides 309 may be provided. Spacings 323 between the waveguides 309 at the first end facet 321 correspond to spacings between the optical beams 302 of a SLED array (shown in FIG. 3A as asterisks) are larger than spacings 324 at the second end facet 322. The waveguides 309 may extend and turn in 3D, and may be manufactured in the substrate 320 by 3D writing with a focused high-intensity laser beam. Tapers 312 may be provided in the waveguides 309A for mode conversion. The substrate 320 may include glass, plastic, etc. Input and exit planes of the substrate 320, i.e. planes of the first 321 and second 322 end facets need not be parallel, i.e. they can be tilted with respect to a bottom plane and/or each other. In some embodiments, the first 321 and second 322 end facets are not opposed but joined facets forming a common edge, e.g. they may be at 90° with respect to each other. This may have advantages for compact packaging.

Figure 3B:
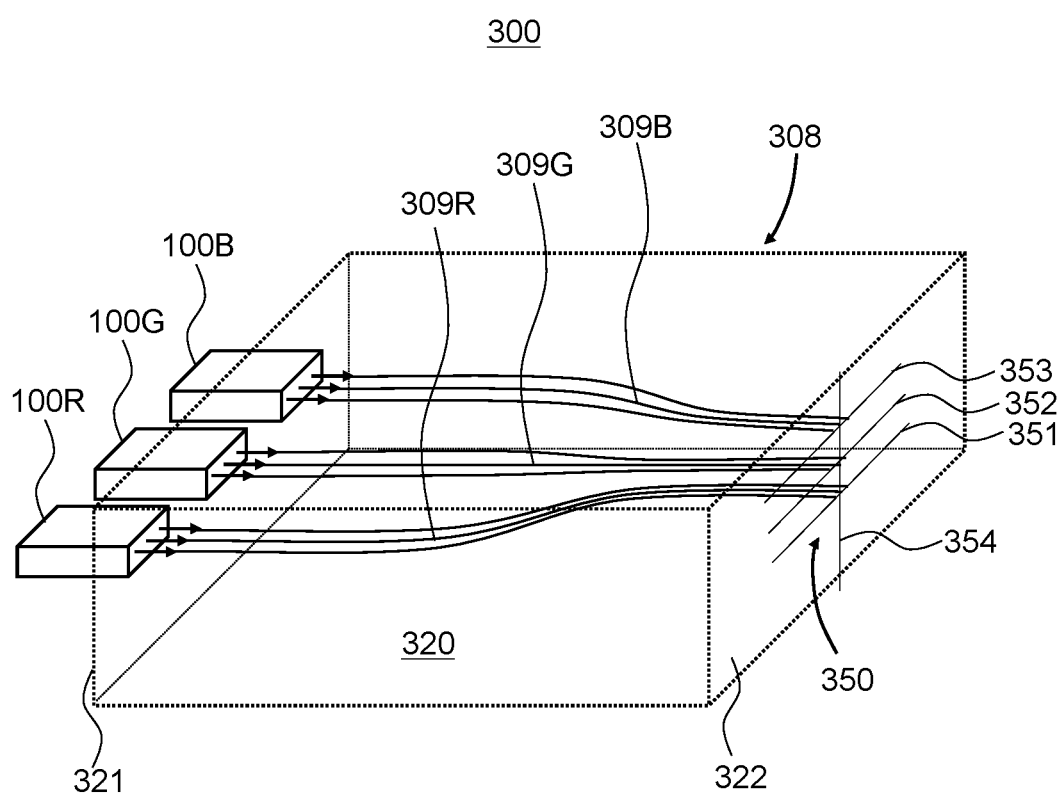
FIG. 3B is a schematic 3D view of a light source using the 3D waveguide concentrator of FIG. 3A.

Referring now to FIG. 3B, an illuminator 300 includes the 3D waveguide concentrator 308 of FIG. 3A. The illuminator 300 may be used in a color projection display. The illuminator 300 further includes a light source subassembly of a red (R) channel solid-state light source 100R, a green (G) channel solid-state light source 100G, and a blue (B) channel solid-state light source 100B. Generally, one, two, three, or more solid-state light sources may be provided. The light sources 100R, 100G, and 100B are disposed side-by-side and coupled to the 3D waveguide concentrator 308. The red-channel light source 100R may include, for example, an array of SLED waveguide structures (not shown in FIG. 3B) supported by a common semiconductor substrate and configured for emitting the plurality of optical beams at an end facet of the semiconductor substrate. The SLED waveguide structures of the red-channel light source 100R may be independently controllable and may independently emit superluminescent light at a wavelength of a red color channel when energized. The wavelengths of different SLED waveguide structures of the red-channel light source 100R may be the same or different wavelengths of the red channel. The green channel solid-state light source 100G and the blue channel solid-state light source 100B may be configured similarly, with the wavelengths of the emitted light being respectively within wavelength bands of the green and blue color channels.

A plurality of waveguides 309R, each extending from the first end 321 to the second end 322 of the substrate 320, convey red channel light emitted by one of the SLED waveguide structures of the red-channel light source 100R. Similarly, a plurality of waveguides 309G, each extending from the first end 321 to the second end 322, convey green channel light emitted by one of the SLED waveguide structures of the green-channel light source 100G; and a plurality of waveguides 309B, each extending from the first end 321 to the second end 322 of the substrate 320, convey blue channel light emitted by one of the SLED waveguide structures of the blue-channel light source 100B. Each waveguide of the pluralities of waveguides 309R, 309G, and 309B is configured for receiving an optical beam of the plurality of optical beams emitted by the corresponding solid-state light sources 100R, 100G, and 100B at the first end 321 of the substrate 320. The horizontal spacings between the waveguides of the pluralities of waveguides 309R, 309G, and 309B at the first end 321 may be larger than at the second end 322.

The waveguides 309R, 309G, and 309B of the waveguide concentrator 308 form a two-dimensional (2D) array of output ports 350 at the second end 322 of the substrate 320 for outputting light propagated in the waveguides 309R, 309G, and 309B. Throughout this specification, the term "output port" means an end of a corresponding waveguide at the second end 322 of the substrate 320.

The 2D array of output ports 350 includes first 351, second 352, and third 353 lines of output ports disposed one under another, as illustrated with a vertical line 354 drawn through middle waveguides of the pluralities of waveguides 309R, 309G, and 309B. The SLED waveguide structures of the red-channel light source 100R are coupled to the output ports disposed along the first line 351; the SLED waveguide structures of the green-channel light source 100G are coupled to the output ports disposed along the second line 352; and the SLED waveguide structures of the blue-channel light source 100B are coupled to the output ports disposed along the third line 353. The exact order of the output ports is unimportant, and the waveguides 309R, 309G, and 309B may be swapped. Furthermore, less or more than the three light sources 100R, 100G, and 100B may be provided. The light sources may belong to different color channels or to a same color channel. To form the 2D array of output ports 350 at the second end 322 of the substrate 320, some or all of the waveguides 309R, 309G, and/or 309B may be disposed and may bend and turn in three dimensions. Such bent and turned waveguides may be formed e.g. by using a high-intensity tightly focused laser to change the refractive index of the substrate 320 near the 3D focal spot location of the laser beam. It is further noted that the facets of the first 321 and second 322 ends may be, but do not need to be, parallel. For example, the facets may form an acute or obtuse angle, and the waveguides 309R, 309G, and 309B may accordingly be "turning" in going from the first 321 to the second 322 end.

It is further noted that the coupling between a light source and a waveguide concentrator needs not be free-space only. It can also be based on a waveguide canal formed by a nanoscribing process forming a tube of a few microns in diameter, where light is guided inside of the tube. With nanoscribing, it becomes possible to guide the light from the output port of the light source to exactly the input of the concentrator. Any free form 3D shape is possible with nanoscribing, so it can be shaped like a wire or light-pipe. This may facilitate optimization of the coupling efficiency.

Figure 4A:
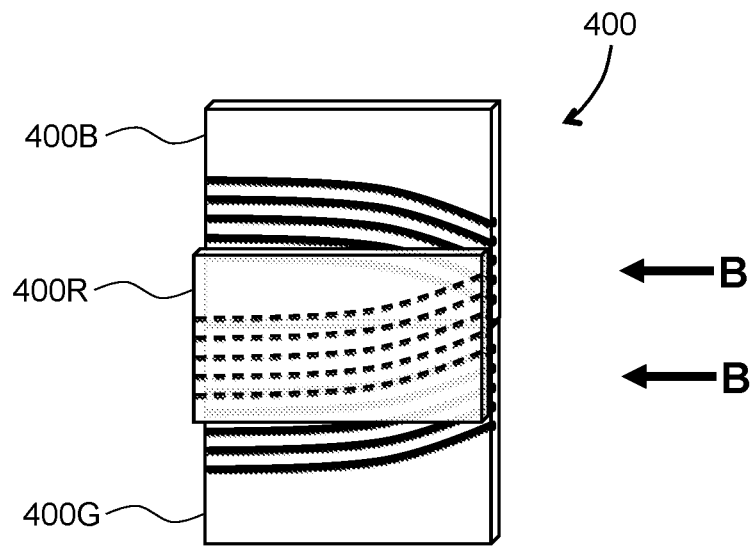
FIG. 4A is a schematic 3D view of a light source including superimposed SLED array chips.
Figure 4B:
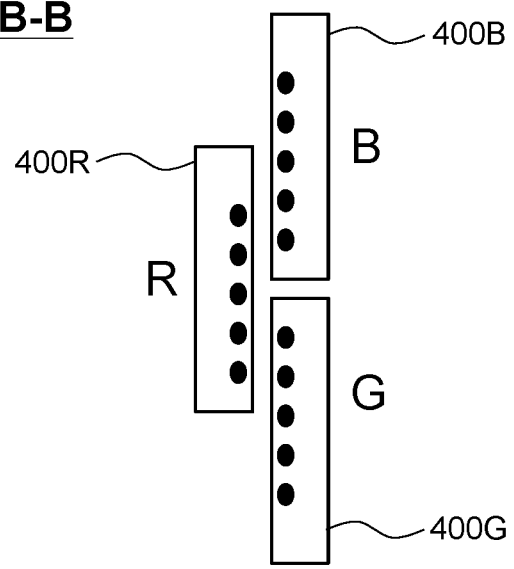
FIG. 4B is a frontal view of the light source of FIG. 4A.

Referring to FIGS. 4A and 4B, SLED arrays 400R, 400G, and 400B are each configured for emitting light of a particular color channel, i.e. red (R) color channel (SLED array 400R); green (G) color channel (SLED array 400G); and blue (B) color channel (SLED array 400B). The SLED arrays 400R, 400G, and 400B may be combined into a light source subassembly 400 to provide a compact multi-color light source, as shown. FIG. 4B shows the red (R) color channel SLED array 400R flipped and brought in close proximity to the green (G) color channel SLED array 400G and blue (B) color channel SLED array 400B. Any orientation of the chips of the SLED arrays 400R, 400G, and 400B is possible, for example all in one line, or with some other color channel flipped. One advantage of the light source subassembly 400 is that the output ends of the waveguides of the SLED arrays 400R, 400G, and 400B are disposed close to each other, and accordingly a waveguide concentrator, if used, may be smaller, lighter, and less expensive to manufacture.

Turning to FIGS. 5A, 5B, and 5C, a 3D waveguide concentrator 508 (FIG. 5B) is an embodiment of the 3D waveguide concentrator 308 of FIG. 3A. The waveguide concentrator 508 of FIG. 5 includes a substrate 520 having first 521 and second 522 end facets. Input light field for the 3D waveguide concentrator 508 of FIG. 5B includes light from the SLED arrays 400R, 400G, and 400B of FIGS. 4A and 4B, which are reproduced in FIG. 5A for convenience. A waveguide 509 is provided for each SLED of each SLED array 400R, 400G, and 400B. Each waveguide 509 extends from the first 521 to the second 522 end facet of the 3D waveguide concentrator 508. Each waveguide 509 may extend and turn in 3D, and may be manufactured in the substrate 520 by 3D writing with a focused laser beam. The waveguides 509 form a tightly spaced array 528 of R, G, and B light fields, which may be configured into a 2D array as shown in FIG. 5C. It is further noted that the waveguide concentrators don't necessarily need to be in 3D. In a 2D configuration, one retains many advantages, and one can make 2D concentrators using lithography, e.g. with host materials different from glass. This may present an advantage for mass production.

Referring to FIGS. 6A and 6B, an illuminator 600 is similar to the illuminator 300 of FIG. 3B but includes a multilayer waveguide concentrator 608 that may be manufactured using 2D lithography techniques. The illuminator 600 of FIGS. 6A and 6B is a compact multi-color, multi-channel light source with output light fields that may be configured into a desired pattern, e.g. where light fields corresponding to a same color channel are lined up into a one-dimensional array, with different one-dimensional arrays corresponding to different color channels disposed side by side, as explained above with reference to FIG. 3B.

The illuminator 600 of FIGS. 6A and 6B includes a light source subassembly having the red channel solid-state light source 100R, the green channel solid-state light source 100G, and the blue channel solid-state light source 100B, disposed side-by-side and coupled to the multilayer waveguide concentrator 608. The red-channel light source 100R may include an array of SLED waveguide structures 604 supported by a common semiconductor substrate 601 and configured for emitting the plurality of optical beams at an end facet of the semiconductor substrate 601. The wavelengths of different SLED waveguide structures of the red-channel light source 100R may be the same or different wavelengths. The green channel solid-state light source 100G and the blue channel solid-state light source 100B may be configured similarly, with the wavelengths of the emitted light being respectively within wavelength bands of the green and blue color channels.

A plurality of waveguides 609R, each extending from the first end 621 to the opposite second end 622 of a substrate 620, convey red channel light emitted by the SLED waveguide structures 604 of the red-channel light source 100R. Similarly, a plurality of waveguides 609G, each extending from the first end 621 to the second end 622, convey green channel light emitted by the SLED waveguide structures of the green-channel light source 100G; and a plurality of waveguides 609B, each extending from the first end 621 to the second end 622 of the substrate 620, convey blue channel light emitted by the SLED waveguide structures of the blue-channel light source 100B. Each waveguide of the pluralities of waveguides 609R, 609G, and 609B is configured for receiving an optical beam of the plurality of optical beams emitted by the corresponding solid-state light sources 100R, 100G, and 100B at the first end 621 of the substrate 620. The horizontal spacings between the waveguides of the pluralities of waveguides 609R, 609G, and 609B at the first end 621 may be larger than at the second end 622. The waveguides 609R, 609G, and 609B of the multilayer waveguide concentrator 608 form a 2D array of output ports 650 (shown in plan view for convenience) at the second end 622 of the substrate 620 for outputting light propagated in the waveguides 609R, 609G, and 609B.

Referring to FIGS. 6B and 6C, the multilayer waveguide concentrator 608 of the illuminator 600 includes a stack of first, second, third, and fourth cladding layers 631, 632, 633, 634 respectively and first, second, and third waveguide layers 641, 642, 643 respectively (FIG. 6B). More or less layers may be provided than shown. At least some of the cladding layers 631, 632, 633, 634 between at least some of the waveguide layers 641, 642, 643 may be thin enough to allow inter-layer light coupling. As an illustration, waveguide sections including waveguide tapers 651 and 652 (FIG. 6C) are separated by the thin second cladding layer 632 and disposed one over the other as shown. The length, shape, and the distance between the waveguide tapers 651 and 652 may be selected so as to couple all light from the bottom waveguide taper 651 to the top waveguide taper 652. In operation, light from individual SLED waveguide structures 604 of the SLED arrays 100R, 100G, and 100B is coupled to waveguides of the first waveguide layer 641. The light from the first waveguide layer 641 is transferred upwards into the second waveguide layer 642, which is disposed closer to the third waveguide layer 643 than the first waveguide layer 641. Multiple interlayer transitions may be required to reduce the vertical spacing between the output light fields to a desired value.

Figure 7:
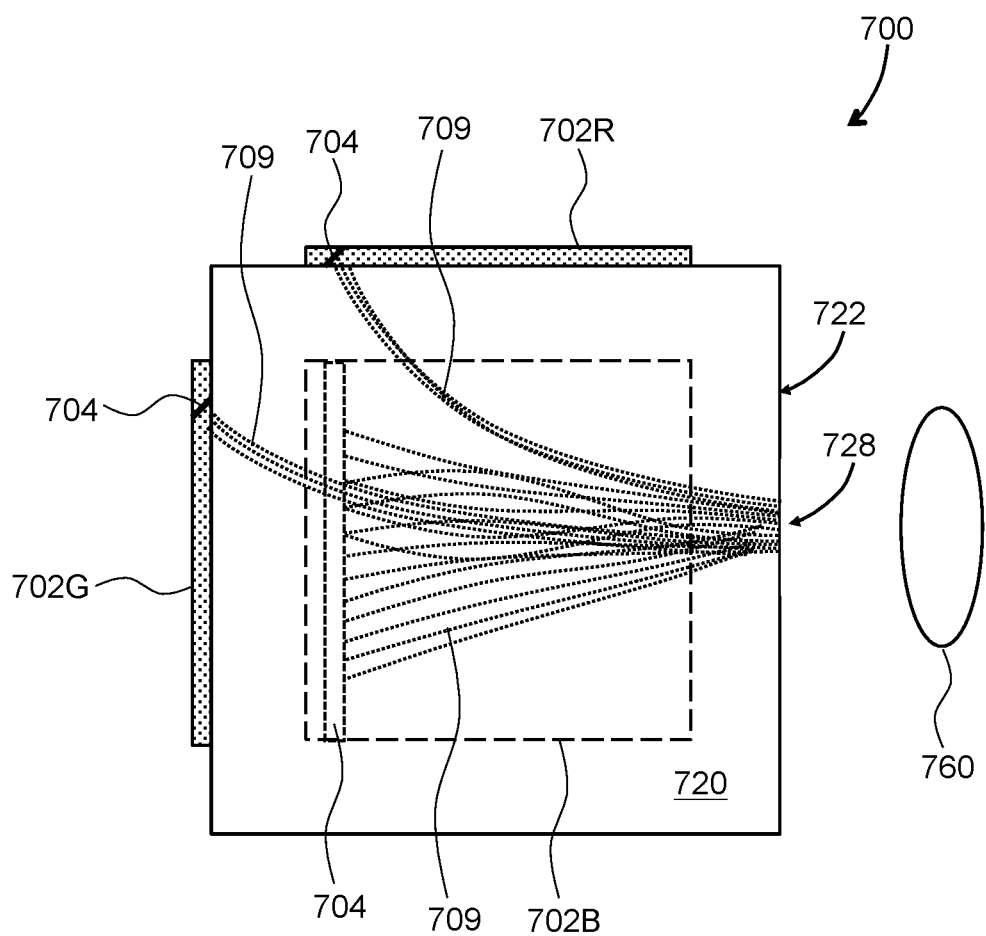
FIG. 7 is a schematic side view of an illuminator including a SLED array concentrator cube.

Referring now to FIG. 7, a cube illuminator 700 includes a SLED array concentrator cube 720 and SLED chips 702R, 702G, and 702B for providing illuminating light at wavelengths of red, green, and blue color channels respectively, mounted on different sides of the concentrator cube 720. The SLED chips 702R, 702G, and 702B may include reflectors 704, e.g. integrated mirrors, slanted facets, and/or Bragg grating structures, that redirect emitted light inside the concentrator cube 720. The concentrator cube 720 includes a plurality of channels or waveguides 709 for redirecting the emitted light to an output light field array 728 of R, G, and B light fields, which may be configured into a 2D array, for example. The output light field array 728 may be disposed at an emitting side 722 of the concentrator cube 720 for collimation by a collimator element 760 such as a lens, a concave mirror, a freeform optical element, etc. Advantages of the cube illuminator 700 include heat redistribution and compactness of packaging. Non-cube shapes of the substrate may be used, e.g. parallelograms, rhombs, etc. Furthermore, it is noted that not only SLEDs but other solid-state light sources, e.g. light-emitting diodes, side-emitting laser diodes, vertical-cavity surface-emitting laser diodes, etc., may be used.

Waveguide concentrators disclosed above may provide a number of advantages. For example, the waveguide concentrators enable the light source to be decoupled from remaining optics, resulting in a compact packaging. Light sources may be easily interchanged between different AR/VR displays and models of displays. Thermal decoupling of the light source is also possible, such that the heating of the light source doesn't misalign optics, 1D/2D scanners, etc. Furthermore, waveguide concentrators may considerably simplify interfacing to optical fibers, which expands possibilities of light delivery to different components and modules of an AR/VR system.

Figure 8:
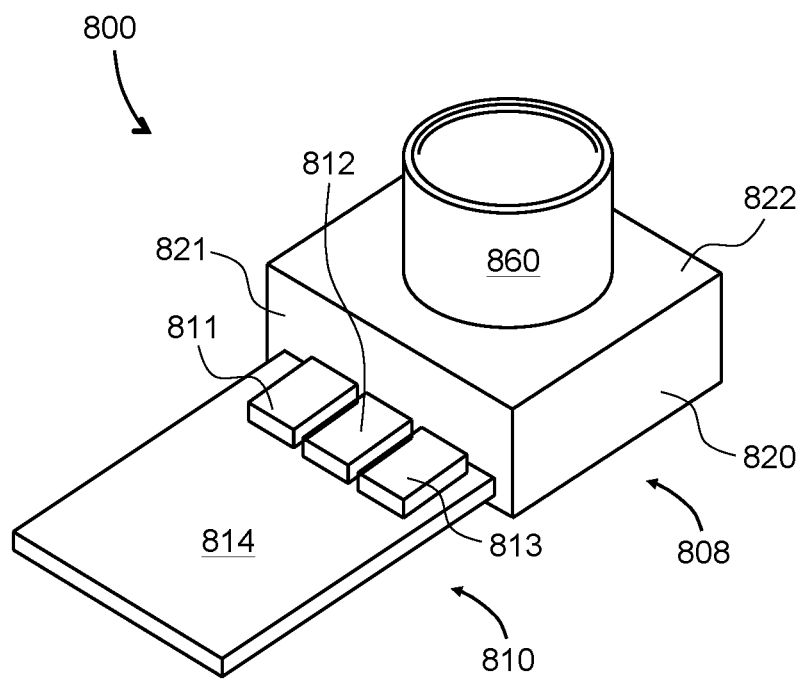
FIG. 8 is an isometric view of an illuminator including a plurality of semiconductor light source chips disposed side-by-side on a common heat sink and coupled to a 90-degree-turn waveguide concentrator.

Turning to FIG. 8, a compact illuminator 800 includes a light source subassembly 810 including first 811, second 812, and third 813 substrates on a common heat sink 814, each substrate 811, 812, 813 supporting a plurality of semiconductor light sources, such as SLEDs, for example. Each substrate 811, 812, 813 may provide light of one of the red, green, and blue color channels.

A 90-degree-turn waveguide concentrator 808 is optically coupled to the light source subassembly 810. Small air gaps may be provided between the first 811, second 812, and third 813 substrates and the 90-degree-turn waveguide concentrator 808, which includes a substrate 820 having first 821 and second 822 joined facets and a plurality of waveguides, not shown, for conveying light from the first 821 to the second 822 joined facet. The waveguides may turn and bend in 3D and/or an integrated mirror may be provided for vertical beam deflection. In some embodiments, the 90-degree-turn waveguide concentrator 808 may include a photonic integrated circuit (PIC) with integrated 90-degree-turn mirrors. A lens 860 may be mounted on the 90-degree-turn waveguide concentrator 808 for collimating optical beams emitted at the second facet 822 of the 90-degree-turn waveguide concentrator 808.

Figure 9:
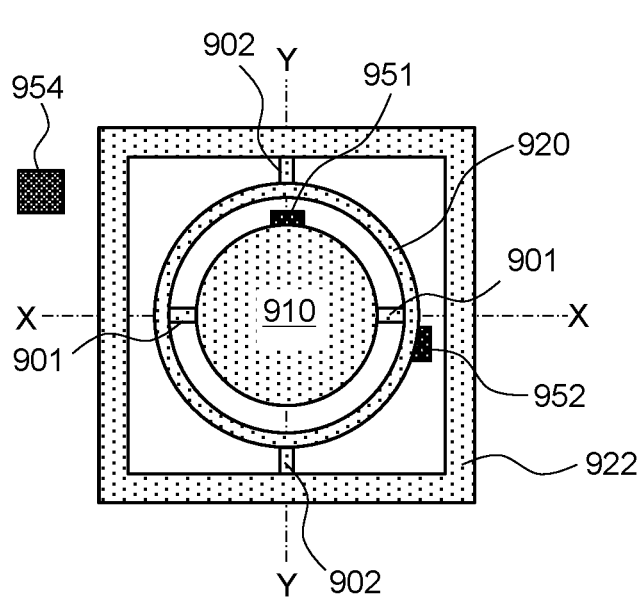
FIG. 9 is a plan view of a 2D tiltable microelectromechanical (MEMS) reflector in accordance with the present disclosure.

Referring to FIG. 9, a two-dimensional (2D) microelectromechanical system (MEMS) scanner 900 includes a tiltable reflector 910 supported by a pair of first torsional hinges 901 allowing tilting the tiltable reflector 910 about X axis. The first torsional hinges 901 extend from the tiltable reflector 910 to a gimbal ring 920, which is supported by a pair of second torsional hinges 902 extending from the gimbal ring 920 to a fixed base 922, for tilting of the gimbal ring 920 and the tiltable reflector 910 about Y axis. Actuators, e.g. electrostatic, electromagnetic, and/or piezo actuators, may be disposed underneath the tiltable reflector 910 and/or the gimbal ring 920 for providing a force for actuating the tilt of the tiltable reflector 910 about X and Y axes. For example, in the embodiment shown in FIG. 9, a first actuator 951 may be disposed under an edge of the tiltable reflector 910 to tilt the tiltable reflector 910 about X-axis. A second actuator 952 may be disposed under the gimbal ring 920 for tilting the gimbal ring 920 and the tiltable reflector 910 about Y-axis.

A feedback circuit 954 may be provided for determining the X- and Y-angles of tilt of the tiltable reflector 910. The feedback circuit 954 may measure electric capacitance between the first electrostatic actuator 951 and the tiltable reflector 910 to determine the X-tilt, and electric capacitance between the second electrostatic actuator 952 and the gimbal ring 920 to determine the Y-tilt. Separate electrodes may also be provided specifically for the feedback circuit 954. In some embodiments, the feedback circuit 954 may provide a sync or triggering pulses when the tiltable reflector 910 is tilted at a certain X- and/or Y-angle.

Figure 10A:
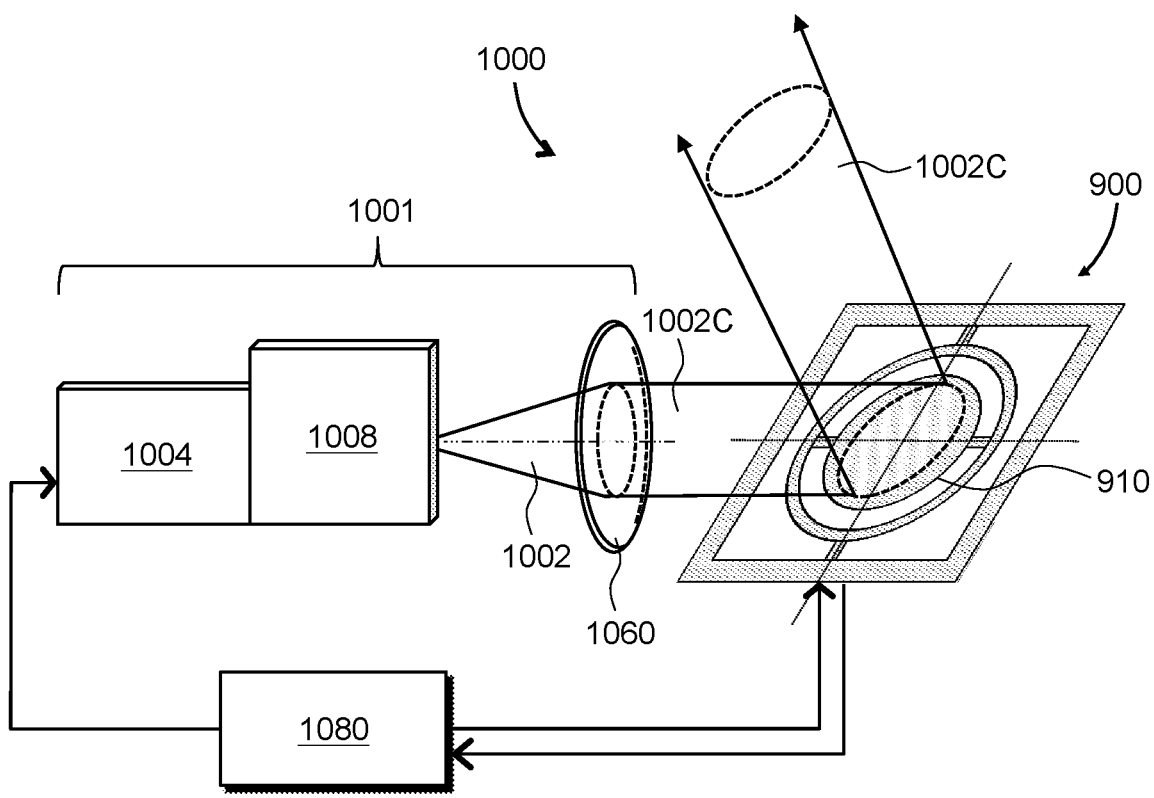
FIG. 10A is a schematic view of a projector including the light source of FIGS. 6A-6C and the 2D tiltable MEMS reflector of FIG. 9.

Referring to FIG. 10A, a projector 1000 for a near-eye display comprises an illuminator 1001 including a solid-state light source 1004, a waveguide concentrator 1008, and a collimator 1060. The illuminator 300 of FIG. 3B, the illuminator 600 of FIGS. 6A and 6B, the cube illuminator 700 of FIG. 7, and/or the compact illuminator 800 of FIG. 8 may be used in place of the illuminator 1001. The projector 1000 further includes the 2D MEMS scanner 900 of FIG. 9 optically coupled to the illuminator 1001, and a controller 1080 operably coupled to the solid-state light source 1004 and the 2D MEMS scanner 900. The solid-state light source 1004 may include a substrate, e.g. a semiconductor chip substrate, supporting a plurality of semiconductor light sources, e.g. an array of SLEDs, for providing the plurality of optical beams 1002 at an end facet of the substrate.

The waveguide concentrator 1008 may include any waveguide concentrator disclosed herein, e.g. the waveguide concentrator 208A of FIG. 2A, the waveguide concentrator 208B of FIG. 2B, the waveguide concentrator 308 of FIGS. 3A and 3B, the waveguide concentrator 508 of FIG. 5B, the waveguide concentrator 608 of FIGS. 6A and 6B, the concentrator cube 720 of FIG. 7, and/or the 90-degree-turn waveguide concentrator 808 of FIG. 8. Some of the advantages brought forward by the waveguide concentrator 1008, and other waveguide concentrators disclosed herein for that matter, may include the following:

(1) The required field of view (FOV) of the collimator 1060 may be smaller, which makes it easier to project the pupil onto the tiltable reflector 910;
(2) Smaller FOV allows one to use smaller diameter collimating optics;
(3) The variable beam waist location may be eliminated. All sources may emit at the same plane, if desired;
(4) One may provide shifts of the beam waist location for each color (R, G, B) to account for chromatic aberration in the collimator optics;
(5) Beam shaping, e.g. changing the elliptical cross-section beam to a circular or other elliptical cross-section beam, can be done in the waveguide concentrator 1008 instead of the collimator 1060;
(6) Freeform or asymmetric optics may be afforded by combination of (3) and (5) above; and
(7) Waveguide coupler allows the opening angles, or divergence angles from the exit face of the waveguide concentrator 1008, to be tuned to better match the desired focal length of the concentrator 1060.

The collimator 1060, e.g. a bulk lens, a Fresnel lens, a diffractive lens, a concave mirror, a freeform optical element, etc., is optically coupled to the waveguide concentrator 1008 to collimate the plurality of optical beams 1002 emitted by the solid-state light source 1004 and guided by the waveguide concentrator 1008, forming a collimated optical beam 1002C. The tiltable reflector 910 of the 2D MEMS scanner 900 is optically coupled to the collimator 1060 for receiving and scanning the collimated optical beam 1002C about X and Y axes. In some embodiments, the collimator 1060, or any other collimator disclosed herein for that matter, may be configured to do at least the following:

(a) Collimate all of the emitters of the solid-state light source 1004 to fill the desired fraction of the tiltable reflector 910;
(b) Shape the optical beam 1002C appropriately. The emitters of the solid-state light source 1004 may emit an elliptical cross section Gaussian beam and may need to be collimated into a round profile or other elliptical pattern;
(c) Image the output pupil of the waveguide concentrator 1008 onto the tiltable reflector 910 such that the beam spots for all the emitters are centered on the tiltable reflector 910; and/or
(d) Correct for the variable beam waist location of the individual emitters, i.e. resulting from light exiting the semiconductor chip at an acute angle.

In some implementations, the 2D MEMS scanner 900 may be replaced with a 1D scanning mirror or a diffractive reflector. A linear array of light sources may be used to provide a plurality of image pixels in a direction perpendicular to the direction of scanning. In some embodiments, the 2D MEMS scanner 900 may be replaced with two 1D scanning mirrors, one for scanning about X axis, and the other for scanning about Y axis.

The controller 1080 may be configured to energize individual SLEDs of the solid-state light source 1004 in coordination with tilting the tiltable reflector 910 to provide an image in angular domain. When viewed by a human eye, the image in angular domain is projected by the eye's cornea and lens to become a spatial-domain image on the eye's retina.

Figure 10B:
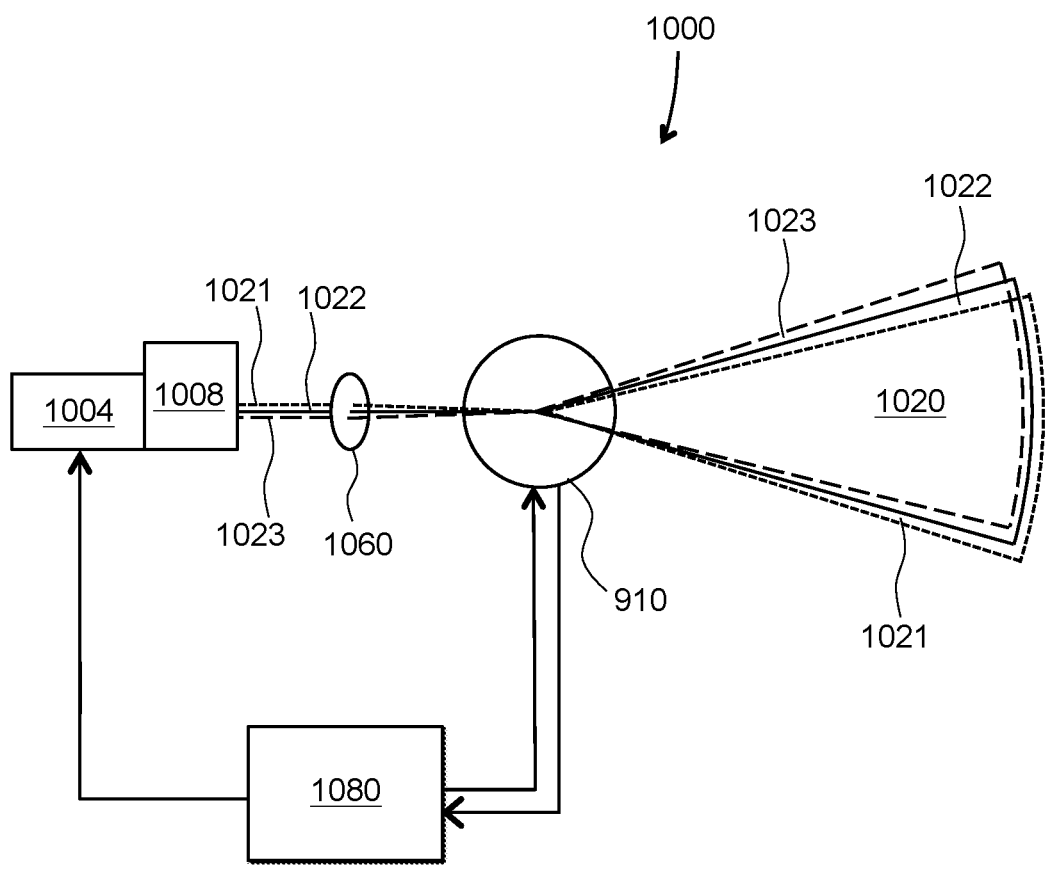
FIG. 10B is a schematic top view of the projector of FIG. 10A illustrating a relationship between fields of view provided by individual emitters of the projector's light source.

The operation of the projector 1000 is further illustrated in FIG. 10B. In this example, the solid-state light source 1004 includes three emitters. The waveguide concentrator 1008 accordingly outputs three parallel diverging beams (only chief rays are shown) 1021 (dotted lines), 1022 (solid lines), and 1023 (dashed lines). The collimator 1060 collimates the beams 1021, 1022, and 1023. By selecting suitable geometry, the collimator 1060 may also function to cause the collimated beams 1021, 1022, and 1023 to impinge onto a center of the tiltable reflector 910, e.g. a mirror or a diffractive reflector, for scanning all three beams 1021, 1022, and 1023. Since the angles of incidence of the beams 1021, 1022, and 1023 onto the tiltable reflector 910 are different, respective scanning areas 1031 (dotted lines), 1032 (solid lines), and 1033 (dashed lines) of the beams 1021, 1022, and 1023 are mutually offset as shown. The controller 1080 may take these offsets into account by providing corresponding delays to the driving signals of the three emitters of the solid-state light source 1004. Offsets may be provided such as to effectively tripe the spatial resolution of the projector 1000 in a common scan area 1020 as compared to a case of a single emitter.

Figure 11:
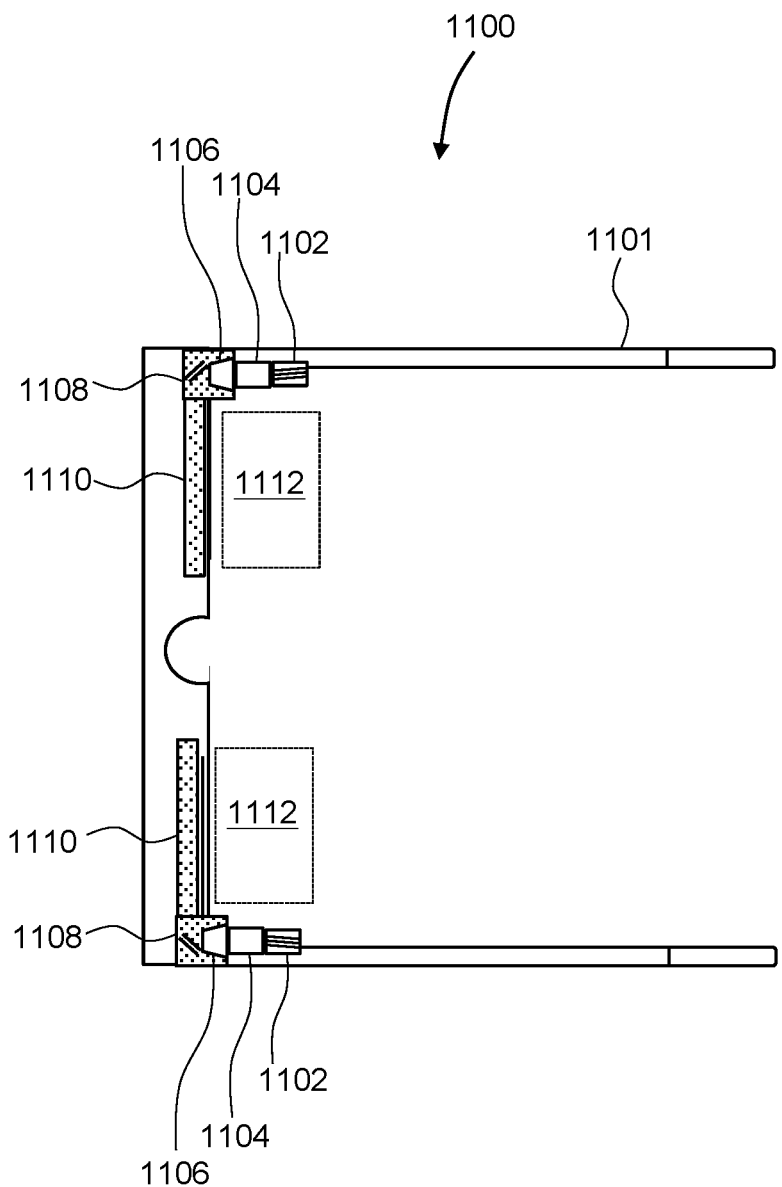
FIG. 11 is a schematic top view of a near-eye display including a projector described herein.

Turning to FIG. 11, a near-eye display 1100 of this disclosure includes a frame 1101 having a sunglasses form factor. The frame 1101 supports, for each eye: a light source subassembly 1102, a waveguide concentrator 1104 optically coupled to the light source subassembly 1102, a collimator 1106 optically coupled to the waveguide concentrator 1104, a scanner 1108 optically coupled to the collimator 1106, and a pupil replicator 1110 optically coupled to the scanner 1108. The light source subassembly 1102 may include a substrate supporting a plurality of semiconductor light sources, e.g. SLEDs, for providing a plurality of optical beams. The waveguide concentrator 1104 may include a plurality of waveguides extending between two end facets, for receiving and guiding the plurality of optical beams in the plurality of waveguides, as described above. By way of non-limiting examples, the light source subassembly 1102 and the waveguide concentrator 1104 may include the array of solid-state light sources 100 coupled to the waveguide concentrator 208A of FIG. 2A or the waveguide concentrator 208B of FIG. 2B, the illuminator 300 of FIG. 3B, the illuminator 600 of FIG. 6A, the illuminator 700 of FIG. 7, etc. The collimator 1106 may be based on a concave mirror, a bulk lens, a Fresnel lens, a holographic lens, etc., and may be integrated with the light source subassembly 1102 and the waveguide concentrator 1104 e.g. as illustrated in FIG. 8 showing the illuminator 800. By way of non-limiting examples, the scanner 1108 may include, the 2D MEMS scanner 900 of FIGS. 9 and 10A having a single tiltable reflector 910, or a scanner including a pair of 1D tiltable reflectors optically coupled via a pupil relay. The function of the pupil replicator 1110 is to provide multiple laterally offset copies of the optical beams redirected or scanned by the scanner 1108 at an eyebox 1112.

Embodiments of the present disclosure may include, or be implemented in conjunction with, an artificial reality system. An artificial reality system adjusts sensory information about outside world obtained through the senses such as visual information, audio, touch (somatosensation) information, acceleration, balance, etc., in some manner before presentation to a user. By way of non-limiting examples, artificial reality may include virtual reality (VR), augmented reality (AR), mixed reality (MR), hybrid reality, or some combination and/or derivatives thereof. Artificial reality content may include entirely generated content or generated content combined with captured (e.g., real-world) content. The artificial reality content may include video, audio, somatic or haptic feedback, or some combination thereof. Any of this content may be presented in a single channel or in multiple channels, such as in a stereo video that produces a three-dimensional effect to the viewer. Furthermore, in some embodiments, artificial reality may also be associated with applications, products, accessories, services, or some combination thereof, that are used to, for example, create content in artificial reality and/or are otherwise used in (e.g., perform activities in) artificial reality. The artificial reality system that provides the artificial reality content may be implemented on various platforms, including a wearable display such as an HMD connected to a host computer system, a standalone HMD, a near-eye display having a form factor of eyeglasses, a mobile device or computing system, or any other hardware platform capable of providing artificial reality content to one or more viewers.

Figure 12A:
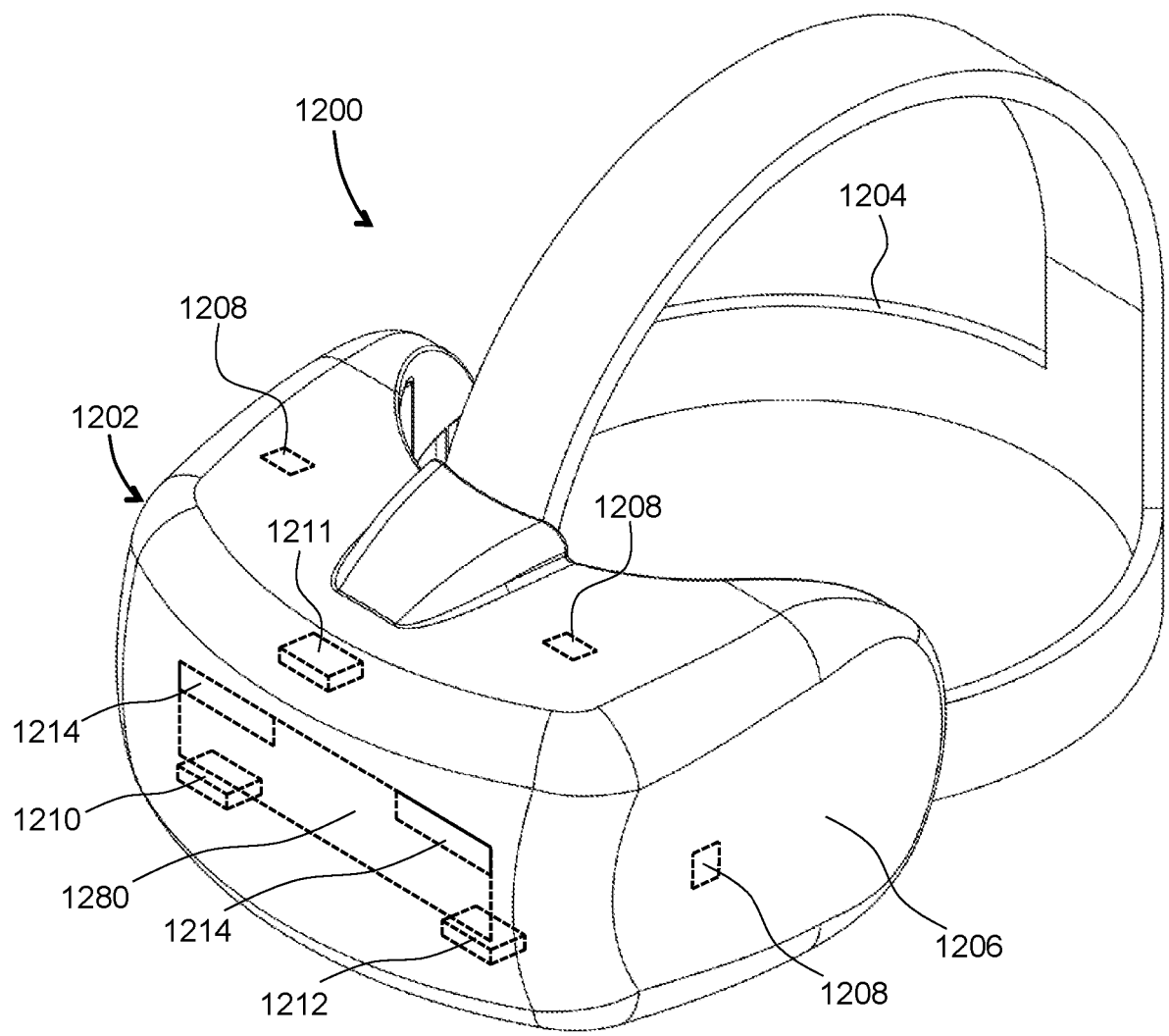
FIG. 12A is an isometric view of a head-mounted display of the present disclosure.

Referring to FIG. 12A, an HMD 1200 is an example of an AR/VR wearable display system which encloses the user's face, for a greater degree of immersion into the AR/VR environment. The HMD 1200 may include light sources, illuminators, and/or projectors disclosed herein. The function of the HMD 1200 is to augment views of a physical, real-world environment with computer-generated imagery, and/or to generate the entirely virtual 3D imagery. The HMD 1200 may include a front body 1202 and a band 1204. The front body 1202 is configured for placement in front of eyes of a user in a reliable and comfortable manner, and the band 1204 may be stretched to secure the front body 1202 on the user's head. A display system 1280 may be disposed in the front body 1202 for presenting AR/VR imagery to the user. Sides 1206 of the front body 1202 may be opaque or transparent.

In some embodiments, the front body 1202 includes locators 1208 and an inertial measurement unit (IMU) 1210 for tracking acceleration of the HMD 1200, and position sensors 1212 for tracking position of the HMD 1200. The IMU 1210 is an electronic device that generates data indicating a position of the HMD 1200 based on measurement signals received from one or more of position sensors 1212, which generate one or more measurement signals in response to motion of the HMD 1200. Examples of position sensors 1212 include: one or more accelerometers, one or more gyroscopes, one or more magnetometers, another suitable type of sensor that detects motion, a type of sensor used for error correction of the IMU 1210, or some combination thereof. The position sensors 1212 may be located external to the IMU 1210, internal to the IMU 1210, or some combination thereof.

The locators 1208 are traced by an external imaging device of a virtual reality system, such that the virtual reality system can track the location and orientation of the entire HMD 1200. Information generated by the IMU 1210 and the position sensors 1212 may be compared with the position and orientation obtained by tracking the locators 1208, for improved tracking accuracy of position and orientation of the HMD 1200. Accurate position and orientation is important for presenting appropriate virtual scenery to the user as the latter moves and turns in 3D space.

The HMD 1200 may further include a depth camera assembly (DCA) 1211, which captures data describing depth information of a local area surrounding some or all of the HMD 1200. To that end, the DCA 1211 may include a laser radar (LIDAR), or a similar device. The depth information may be compared with the information from the IMU 1210, for better accuracy of determination of position and orientation of the HMD 1200 in 3D space.

The HMD 1200 may further include an eye tracking system 1214 for determining orientation and position of user's eyes in real time. The obtained position and orientation of the eyes also allows the HMD 1200 to determine the gaze direction of the user and to adjust the image generated by the display system 1280 accordingly. In one embodiment, the vergence, that is, the convergence angle of the user's eyes gaze, is determined. The determined gaze direction and vergence angle may also be used for real-time compensation of visual artifacts dependent on the angle of view and eye position. Furthermore, the determined vergence and gaze angles may be used for interaction with the user, highlighting objects, bringing objects to the foreground, creating additional objects or pointers, etc. An audio system may also be provided including e.g. a set of small speakers built into the front body 1202.

Figure 12B:
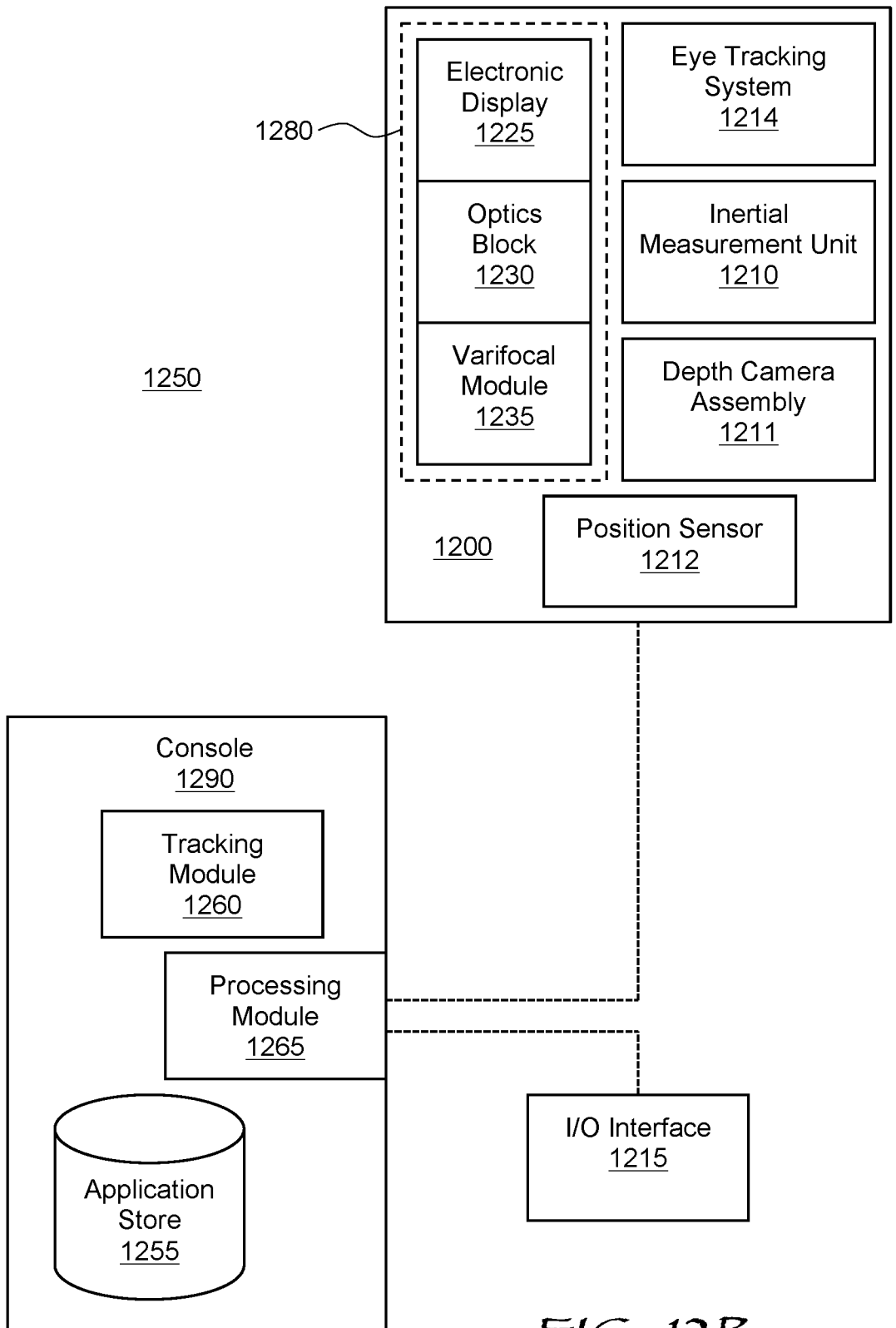
FIG. 12B is a block diagram of a virtual reality system including the headset of FIG. 12A.

Referring to FIG. 12B, an AR/VR system 1250 may include light sources and projector displays disclosed herein. The AR/VR system 1250 includes the HMD 1200 of FIG. 12A, an external console 1290 storing various AR/VR applications, setup and calibration procedures, 3D videos, etc., and an input/output (I/O) interface 1215 for operating the console 1290 and/or interacting with the AR/VR environment. The HMD 1200 may be "tethered" to the console 1290 with a physical cable, or connected to the console 1290 via a wireless communication link such as Bluetooth®, Wi-Fi, etc. There may be multiple HMDs 1200, each having an associated I/O interface 1215, with each HMD 1200 and I/O interface(s) 1215 communicating with the console 1290. In alternative configurations, different and/or additional components may be included in the AR/VR system 1250. Additionally, functionality described in conjunction with one or more of the components shown in FIGS. 12A and 12B may be distributed among the components in a different manner than described in conjunction with FIGS. 12A and 12B in some embodiments. For example, some or all of the functionality of the console 1215 may be provided by the HMD 1200, and vice versa. The HMD 1200 may be provided with a processing module capable of achieving such functionality.

As described above with reference to FIG. 12A, the HMD 1200 may include the eye tracking system 1214 (FIG. 12B) for tracking eye position and orientation, determining gaze angle and convergence angle, etc., the IMU 1210 for determining position and orientation of the HMD 1200 in 3D space, the DCA 1211 for capturing the outside environment, the position sensor 1212 for independently determining the position of the HMD 1200, and the display system 1280 for displaying AR/VR content to the user. The display system 1280 includes (FIG. 12B) an electronic display 1225, for example and without limitation, a liquid crystal display (LCD), an organic light emitting display (OLED), an inorganic light emitting display (ILED), an active-matrix organic light-emitting diode (AMOLED) display, a transparent organic light emitting diode (TOLED) display, a projector, or a combination thereof. The display system 1280 further includes an optics block 1230, whose function is to convey the images generated by the electronic display 1225 to the user's eye. The optics block may include various lenses, e.g. a refractive lens, a Fresnel lens, a diffractive lens, an active or passive Pancharatnam-Berry phase (PBP) lens, a liquid lens, a liquid crystal lens, etc., a pupil-replicating waveguide, grating structures, coatings, etc. The display system 1280 may further include a varifocal module 1235, which may be a part of the optics block 1230. The function of the varifocal module 1235 is to adjust the focus of the optics block 1230 e.g. to compensate for vergence-accommodation conflict, to correct for vision defects of a particular user, to offset aberrations of the optics block 1230, etc.

The I/O interface 1215 is a device that allows a user to send action requests and receive responses from the console 1290. An action request is a request to perform a particular action. For example, an action request may be an instruction to start or end capture of image or video data or an instruction to perform a particular action within an application. The I/O interface 1215 may include one or more input devices, such as a keyboard, a mouse, a game controller, or any other suitable device for receiving action requests and communicating the action requests to the console 1290. An action request received by the I/O interface 1215 is communicated to the console 1290, which performs an action corresponding to the action request. In some embodiments, the I/O interface 1215 includes an IMU that captures calibration data indicating an estimated position of the I/O interface 1215 relative to an initial position of the I/O interface 1215. In some embodiments, the I/O interface 1215 may provide haptic feedback to the user in accordance with instructions received from the console 1290. For example, haptic feedback can be provided when an action request is received, or the console 1290 communicates instructions to the I/O interface 1215 causing the I/O interface 1215 to generate haptic feedback when the console 1290 performs an action.

The console 1290 may provide content to the HMD 1200 for processing in accordance with information received from one or more of: the IMU 1210, the DCA 1212, the eye tracking system 1214, and the I/O interface 1215. In the example shown in FIG. 12B, the console 1290 includes an application store 1255, a tracking module 1260, and a processing module 1265. Some embodiments of the console 1290 may have different modules or components than those described in conjunction with FIG. 12B. Similarly, the functions further described below may be distributed among components of the console 1290 in a different manner than described in conjunction with FIGS. 12A and 12B.

The application store 1255 may store one or more applications for execution by the console 1290. An application is a group of instructions that, when executed by a processor, generates content for presentation to the user. Content generated by an application may be in response to inputs received from the user via movement of the HMD 1200 or the I/O interface 1215. Examples of applications include: gaming applications, presentation and conferencing applications, video playback applications, or other suitable applications.

The tracking module 1260 may calibrate the AR/VR system 1250 using one or more calibration parameters and may adjust one or more calibration parameters to reduce error in determination of the position of the HMD 1200 or the I/O interface 1215. Calibration performed by the tracking module 1260 also accounts for information received from the IMU 1210 in the HMD 1200 and/or an IMU included in the I/O interface 1215, if any. Additionally, if tracking of the HMD 1200 is lost, the tracking module 1260 may re-calibrate some or all of the AR/VR system 1250.

The tracking module 1260 may track movements of the HMD 1200 or of the I/O interface 1215, the IMU 1210, or some combination thereof. For example, the tracking module 1260 may determine a position of a reference point of the HMD 1200 in a mapping of a local area based on information from the HMD 1200. The tracking module 1260 may also determine positions of the reference point of the HMD 1200 or a reference point of the I/O interface 1215 using data indicating a position of the HMD 1200 from the IMU 1210 or using data indicating a position of the I/O interface 1215 from an IMU included in the I/O interface 1215, respectively. Furthermore, in some embodiments, the tracking module 1260 may use portions of data indicating a position or the HMD 1200 from the IMU 1210 as well as representations of the local area from the DCA 1211 to predict a future location of the HMD 1200. The tracking module 1260 provides the estimated or predicted future position of the HMD 1200 or the I/O interface 1215 to the processing module 1265.

The processing module 1265 may generate a 3D mapping of the area surrounding some or all of the HMD 1200 ("local area") based on information received from the HMD 1200. In some embodiments, the processing module 1265 determines depth information for the 3D mapping of the local area based on information received from the DCA 1211 that is relevant for techniques used in computing depth. In various embodiments, the processing module 1265 may use the depth information to update a model of the local area and generate content based in part on the updated model.

The processing module 1265 executes applications within the AR/VR system 1250 and receives position information, acceleration information, velocity information, predicted future positions, or some combination thereof, of the HMD 1200 from the tracking module 1260. Based on the received information, the processing module 1265 determines content to provide to the HMD 1200 for presentation to the user. For example, if the received information indicates that the user has looked to the left, the processing module 1265 generates content for the HMD 1200 that mirrors the user's movement in a virtual environment or in an environment augmenting the local area with additional content. Additionally, the processing module 1265 performs an action within an application executing on the console 1290 in response to an action request received from the I/O interface 1215 and provides feedback to the user that the action was performed. The provided feedback may be visual or audible feedback via the HMD 1200 or haptic feedback via the I/O interface 1215.

In some embodiments, based on the eye tracking information (e.g., orientation of the user's eyes) received from the eye tracking system 1214, the processing module 1265 determines resolution of the content provided to the HMD 1200 for presentation to the user on the electronic display 1225. The processing module 1265 may provide the content to the HMD 1200 having a maximum pixel resolution on the electronic display 1225 in a foveal region of the user's gaze. The processing module 1265 may provide a lower pixel resolution in other regions of the electronic display 1225, thus lessening power consumption of the AR/VR system 1250 and saving computing resources of the console 1290 without compromising a visual experience of the user. In some embodiments, the processing module 1265 can further use the eye tracking information to adjust where objects are displayed on the electronic display 1225 to prevent vergence-accommodation conflict and/or to offset optical distortions and aberrations.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A projector comprising:
   a light source subassembly comprising a substrate supporting a plurality of semiconductor light sources for providing a plurality of optical beams;
   a waveguide concentrator comprising first and second end facets and a plurality of waveguides extending between the first and second end facets, wherein the waveguide concentrator is optically coupled to the light source subassembly at the first end facet for receiving and guiding the plurality of optical beams in the plurality of waveguides, and wherein spacings between the waveguides at the first end facet are larger than at the second end facet;
   a collimator optically coupled to the waveguide concentrator at the second end facet thereof; and
   a tiltable reflector optically coupled to the collimator for receiving and redirecting the plurality of optical beams collimated by the collimator;
   wherein the collimator is configured for collimating the plurality of optical beams emitted at the second end facet of the waveguide concentrator, and for redirecting the plurality of optical beams to impinge onto the tiltable reflector.

2. The projector of claim 1, further comprising a controller operably coupled to the light source subassembly and the tiltable reflector and configured to energize the plurality of semiconductor light sources in coordination with operating the tiltable reflector.

3. The projector of claim 1, wherein each semiconductor light source of the plurality of semiconductor light sources comprises at least one of: a superluminescent light-emitting diode, a laser diode, a vertical-cavity surface-emitting laser diode, or a light-emitting diode.

4. The projector of claim 1, wherein the collimator comprises a lens.

5. The projector of claim 1, wherein the tiltable reflector comprises a microelectromechanical system (MEMS).

6. The projector of claim 1, wherein the plurality of semiconductor light sources comprises an array of superluminescent light-emitting diodes (SLEDs).

7. The projector of claim 1, wherein each waveguide of the plurality of waveguides forms an acute angle with the first end facet in a plane of the waveguide concentrator.

8. The projector of claim 1, wherein the waveguides of the waveguide concentrator form a two-dimensional array of output ports at the second end facet for outputting light propagated therein.

9. The projector of claim 8, wherein at least some of the waveguides of the waveguide concentrator extend in three dimensions.

10. The projector of claim 1, wherein the waveguide concentrator comprises a stack of layers, wherein at least some of the waveguides of the waveguide concentrator comprise a plurality of waveguide sections disposed in different layers of the stack of layers and optically coupled by inter-layer couplers.

11. The projector of claim 1, wherein the first and second end facets of the waveguide concentrator are disposed opposite each other.

12. The projector of claim 1, wherein each waveguide of the plurality of waveguides has a first propagation mode at the first end facet larger than a second propagation mode at the second end facet.

13. A near-eye display comprising:
a light source subassembly comprising a substrate supporting a plurality of semiconductor light sources for providing a plurality of optical beams;
a waveguide concentrator comprising first and second ends and a plurality of waveguides extending between the first and second ends, wherein the waveguide concentrator is optically coupled to the light source subassembly at the first end for receiving and guiding the plurality of optical beams in the plurality of waveguides, and wherein spacings between the waveguides at the first end are larger than at the second end;
a collimator optically coupled to the waveguide concentrator at the second end thereof for collimating the plurality of optical beams emitted at the second end;
a tiltable reflector optically coupled to the collimator for receiving and redirecting the plurality of optical beams collimated by the collimator; and
a pupil replicator optically coupled to the tiltable reflector and configured for providing multiple laterally offset copies of the optical beams redirected by the tiltable reflector.

14. The near-eye display of claim 13, wherein the plurality of semiconductor light sources comprises an array of superluminescent light-emitting diodes.

15. The near-eye display of claim 13, further comprising a controller operably coupled to the light source subassembly and the tiltable reflector and configured to energize the plurality of semiconductor light sources in coordination with operating the tiltable reflector to provide an image in angular domain.

16. The near-eye display of claim 13, wherein the tiltable reflector comprises a microelectromechanical system (MEMS) biaxially tiltable reflector.

17. The near-eye display of claim 13, wherein each waveguide of the plurality of waveguides forms an acute angle with the first end in a plane of the waveguide concentrator.

18. The near-eye display of claim 13, wherein the waveguides of the waveguide concentrator form a two-dimensional array of output ports at the second end for outputting light propagated therein.

19. The near-eye display of claim 18, wherein at least some of the waveguides of the waveguide concentrator extend in three dimensions.

20. The near-eye display of claim 13, wherein the waveguide concentrator comprises a stack of layers, wherein at least some of the waveguides of the waveguide concentrator comprise a plurality of waveguide sections disposed in different layers of the stack of layers and optically coupled by inter-layer couplers.

\* \* \* \* \*